United States Patent [19]
Rock

[11] Patent Number: 4,461,061
[45] Date of Patent: Jul. 24, 1984

[54] APPARATUS FOR CONNECTING WIRE TO INSULATION DISPLACEMENT-TYPE CONTACTS

[75] Inventor: Lawrence S. Rock, Harpursville, N.Y.

[73] Assignee: Universal Instruments Corporation, Binghamton, N.Y.

[21] Appl. No.: 372,670

[22] Filed: Apr. 28, 1982

[51] Int. Cl.$^{3}$ .......... H05K 13/06
[52] U.S. Cl. .......... 29/33 M; 29/739; 29/566.2; 29/566.3; 29/850
[58] Field of Search .......... 29/566.2, 566.3, 566.4, 29/564.5, 564.8, 850, 861, 751, 753, 866, 33 M, 739, 833; 7/107; 83/380

[56] References Cited

U.S. PATENT DOCUMENTS 4,271,573 6/1981 von Roesgen .......... 29/33 M

*Primary Examiner*—Mark Rosenbaum
*Assistant Examiner*—Joseph Gorski
*Attorney, Agent, or Firm*—Fidelman, Wolffe and Waldron

[57] ABSTRACT

A method and apparatus for connecting wire to insulation displacement-type, circuit board-mounted electrical contacts comprises automatic positioning and orienting of individual contacts relative to a wire insertion head. A portion of wire is fed from a supply to the tip of a pusher which inserts this portion into fingers of the contact; another contact is positioned and oriented relative to the pusher to receive a second portion of the wire and provide a wire run between the contacts. The wire run can be terminated at the last contact without repositioning the contact and pusher relative to each other, with the remaining supply wire being prepared for another insertion.

14 Claims, 19 Drawing Figures

APPARATUS FOR CONNECTING WIRE TO INSULATION DISPLACEMENT-TYPE CONTACTS

CROSS-REFERENCE TO PRIOR ART

U.S. Pat. No. 4,271,573—QUICK-CONNECT INTERCONNECTION SYSTEM—Roesgen, issued June 9, 1981.

BACKGROUND AND SUMMARY OF THE INVENTION

The invention is directed to a method and apparatus for connecting wire to circuit board-mounted, insulation displacement contacts (IDC).

Complex electrical circuits are sometimes constructed by interconnecting various electrical points of the circuits by means of insulation displacement contacts connected by wire runs, and various manual and semiautomatic tools for inserting the wire into the contacts have been proposed in the prior art. Representative of such prior art is the above-referenced U.S. Pat. No. 4,271,573, which discloses a hand-held tool for inserting the wire into various contacts of a stationary circuit board, according to a light ray system, in order to provide various wiring runs between the contacts. In order to terminate a particular wire run, several forms of cutting tools are disclosed as attachable to the insertion tool. The prior art has several disadvantages, namely: lack of automation; an inability to cut wire consistently and close enough to an IDC when terminating a run so as to prevent electrical shorting to an adjacent IDC, an inability to cut wire at the last insertion of a wire run while the tool is over the last contact, without the need for repositioning of the insertion tool; and the lack of a structurally sound and efficient cutting means attached advantageously to the insertion portion of the tool. The attached cutters in the prior art provide termination of the runs with an end portion of wire of approximately 0.040 inches protruding from the contacts, thus increasing the possibility of short circuits when the contacts are positioned or populated closely together upon a circuit board.

Accordingly, an object of the instant invention is to provide an insertion tool for forming wire runs, including "daisy chain" runs between contacts as required.

Another object of the instant invention is to cut the wire to terminate a run and prepare the remaining supply wire for additional runs.

An additional object of the invention is to provide automatic positioning of the circuit board or the insert head to align and orient an insulation displacement contact and a pusher of an insertion head relative to each other.

A further object of the invention is to feed and guide wire from a supply spool while eliminating any drag on the feeding as caused by inertia of the supply spool.

An additional object of the invention is to provide vertical reciprocation between the insert head and the circuit board to facilitate installation and removal of circuit boards when operating in an automatic mode.

Another object of the invention is to provide improved speed and accuracy in the wiring of such a circuit board, thus providing an increased cycle rate.

A further object of the invention is to eliminate steps in the termination of a wire run by eliminating the need to reposition the insertion head prior to performing the termination cutting step.

It is a further object of this invention to consistently terminate a wire run close to a contact with very little (i.e., on the order of 0.025 inches) of the wire extending past the contact in order to allow closer spacing of contacts dn a circuit board without electrical short-circuiting of the connected wires.

These and other objects will become apparent from a detailed description of the invention.

In summary, the invention is directed to a method and apparatus for connecting wire to insulation displacement-type, circuit board-mounted electrical contacts, and comprises automatic positioning and orienting of individual contacts relative to a wire insertion head so that a portion of wire is fed from a supply to the tip of a pusher of the insert head. The pusher inserts this portion of wire into the fingers of the contact to provide an electrical and mechanical connection. Another contact is positioned and oriented relative to the pusher to receive a second portion of the wire and provide a wire run between the contacts. The wire run can be terminated at the last contact without repositioning the contact and pusher relative to each other, with the remaining supply wire being prepared for another insertion.

BRIEF DESCRIPTION OF THE DRAWINGS

Like parts are designated with like characters throughout the drawings.

DETAILED DESCRIPTION OF THE INVENTION

Figure 1:
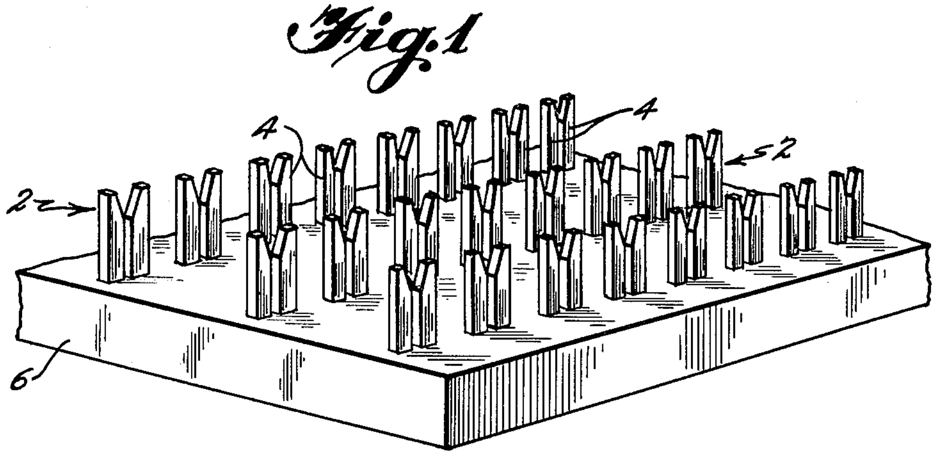
FIG. 1 is a partial perspective of a circuit board having rows of insulation displacement contacts mounted thereon.
Figure 2:
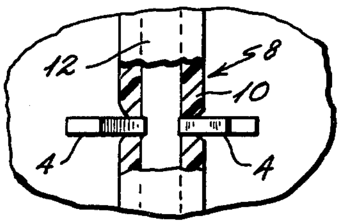
FIG. 2 in an enlarged partial top plan view of an insulation displacement contact with an insulated wire electrically and mechanically attached thereto.

Referring to FIG. 1 and 2, circuit board 6 is provided with plural rows of insulation displacement contacts 2 mounted thereon. It should be noted that arrangement of the contacts 2 as shown in FIG. 1 is advantageous for X-Y positioning of individual components relative to an insert head, but that other orientations may be accommodated by the instant invention. Each contact 2 is bifurcated to provide fingers 4 between which wire 10 is forced such that insulation 10 is displaced and electrical contact is completed between conductor 12 and fingers 4, as illustrated in FIG. 2.

Figure 3A:
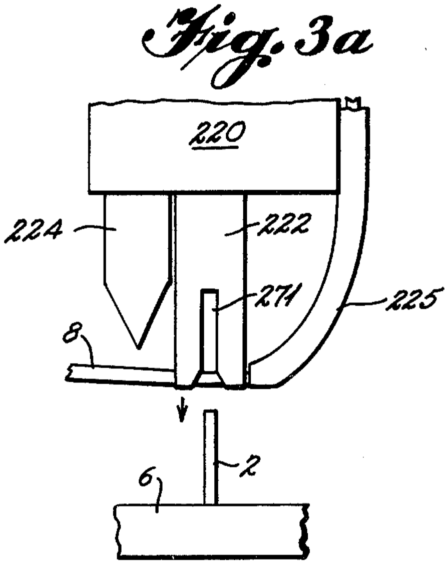
FIGS. 3A–3C are side elevations of a prior art device and depict the various steps of connecting wire to insulation displacement contacts and the subsequent cutting of the wire to terminate a wire run.
Figure 3B:
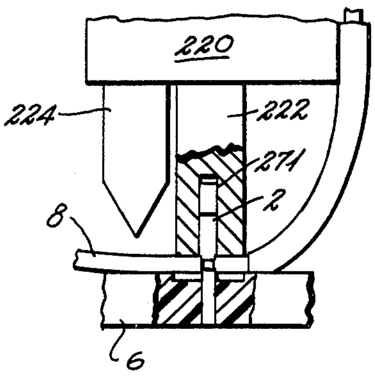
Figure 3C:
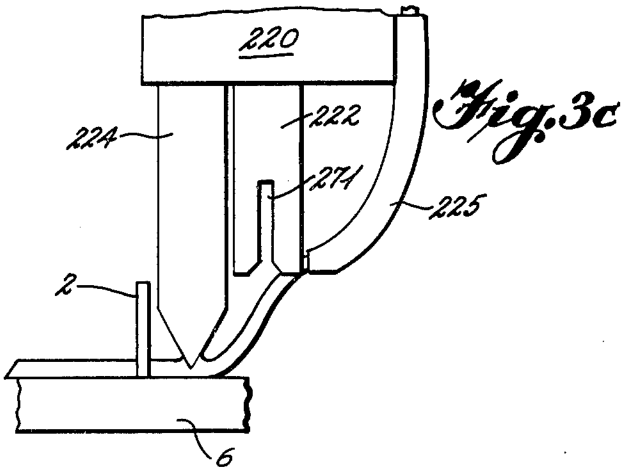

FIGS. 3A–3C illustrate the various steps needed for insertion of a wire into a contact and for termination of the wire at the contact when using a prior art device as described in U.S. Pat. No. 4,271,573. This device includes a handle 220, pusher 222, feed tube 225, and vertically displaceable cutting member 224. Pusher 222 is provided with a slot 271 in the tip thereof, such that the pusher 222 may fit over fingers 4 of an insulation displacement contact 2. Another slot (not shown), of smaller depth than slot 271, is provided in the tip of pusher 222 and intersects slot 271 at right angles; this other slot receives wire 8 through feed tube 225 to facilitate connection of wire 8 to insulation displacement contact 2. As seen in FIG. 3A, wire 8 is in position (in the other slot of pusher 222) and pusher 222 is moving downwardly to push a portion of the wire 8 between fingers 4 of the contact 2. FIG. 3B discloses the contact 2 received within slot 271 of pusher 222 and wire 8 pushed down between the fingers of the contact. In order to terminate a wire run at the contact with this prior art, it is necessary to raise the tool and remove the pusher 222 from contact 2, position cutting member 224 on the other side of the contact, and then cut the wire, as illustrated in FIG. 3C. As may be appreciated from the following disclosure, this additional repositioning step is obviated by the instant invention in a most advantageous manner.

Figure 4:
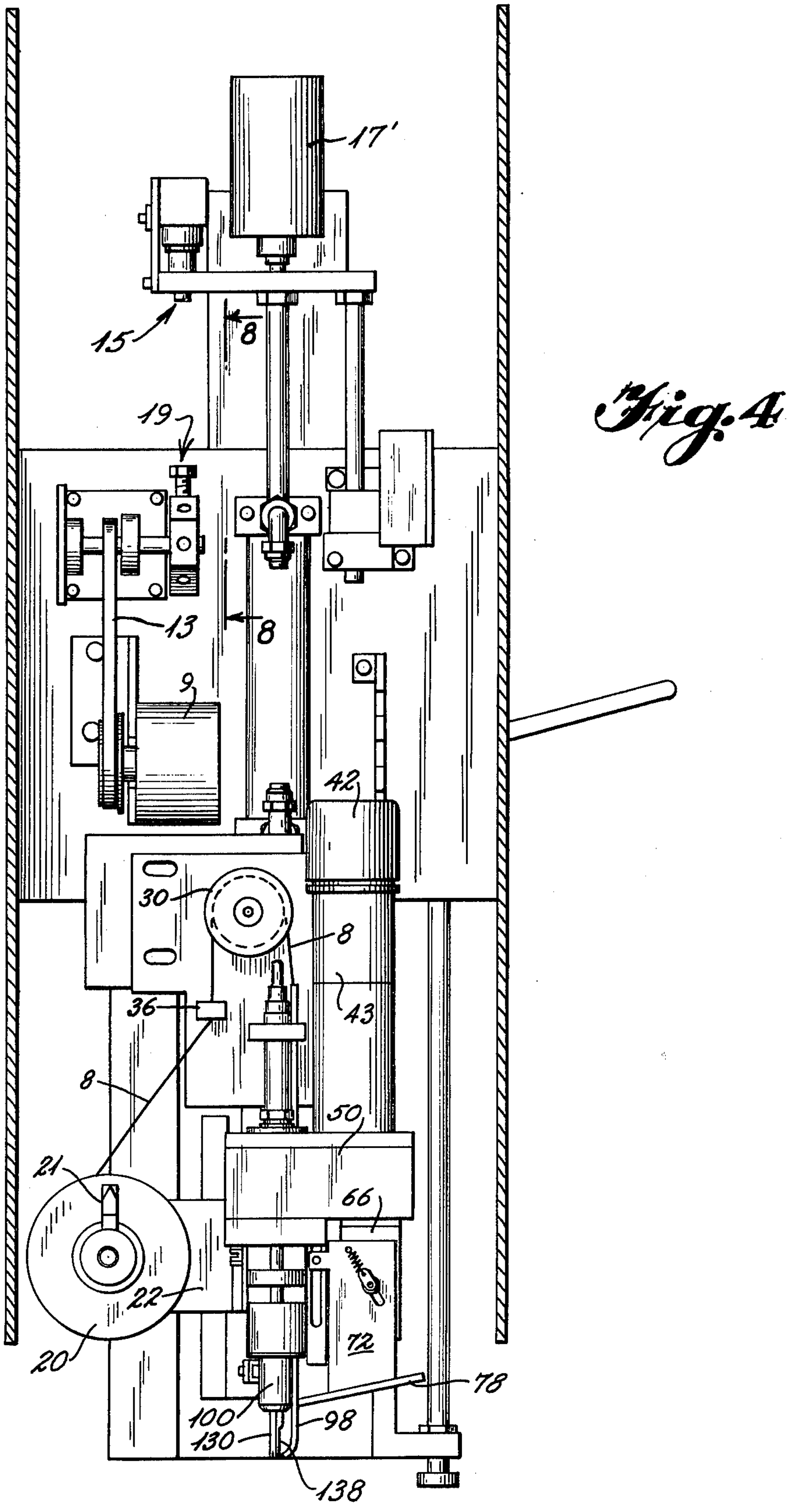
FIG. 4 is a partial front elevation of the instant invention.
Figure 5:
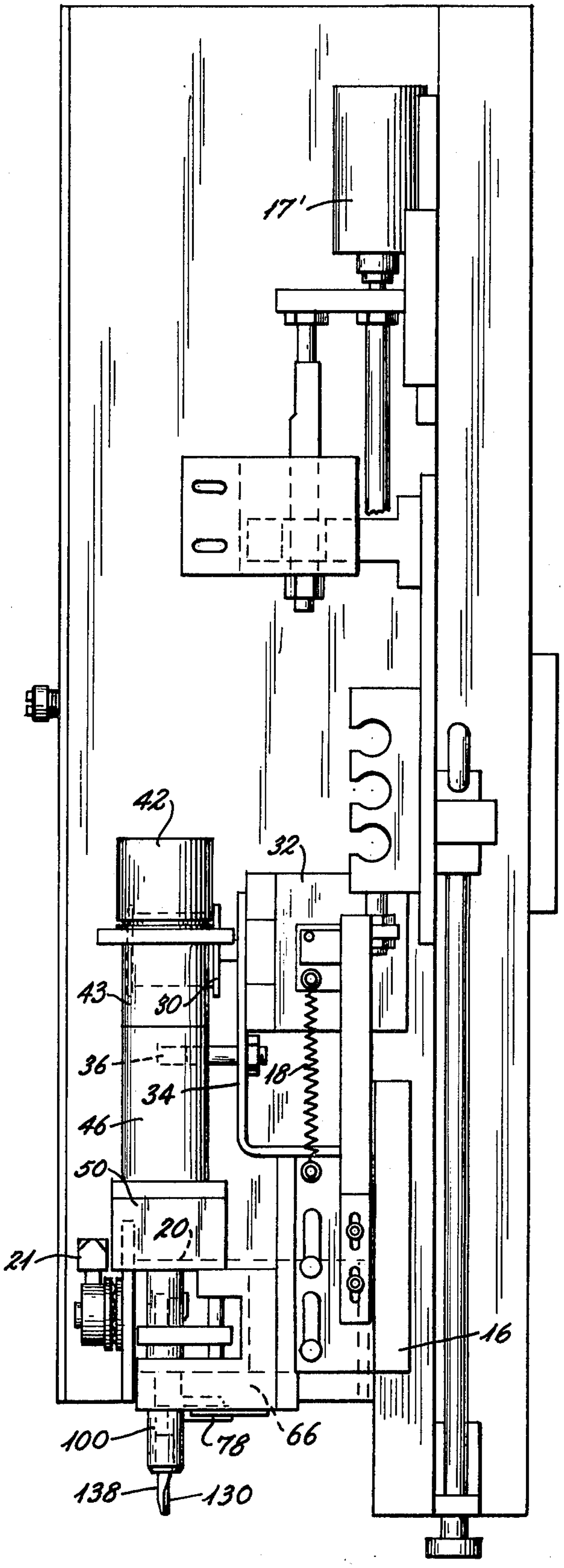
FIG. 5 is a right side elevation, of FIG. 4.
Figure 6:
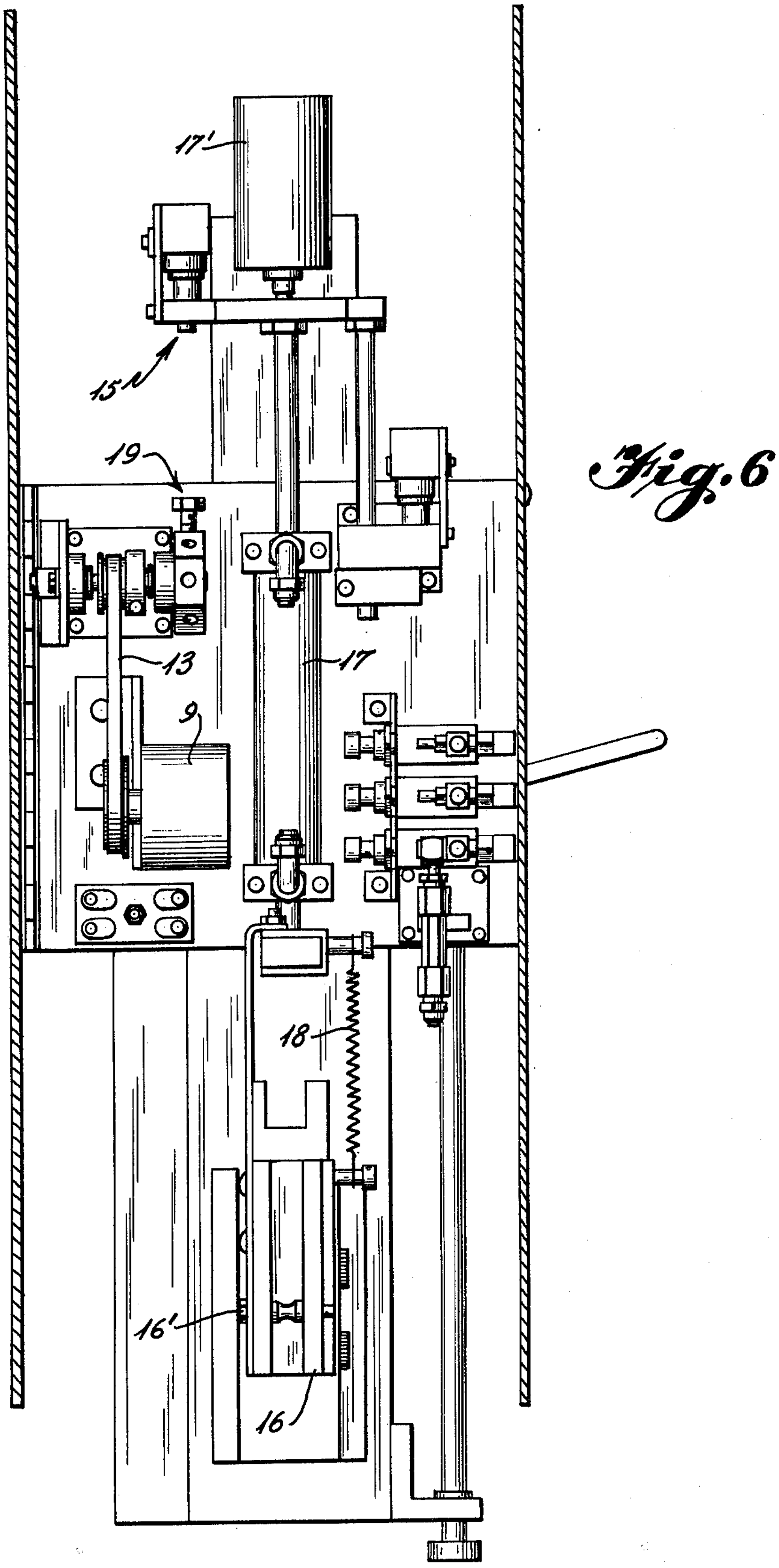
FIG. 6 is a front elevation of a main support frame.
Figure 7:
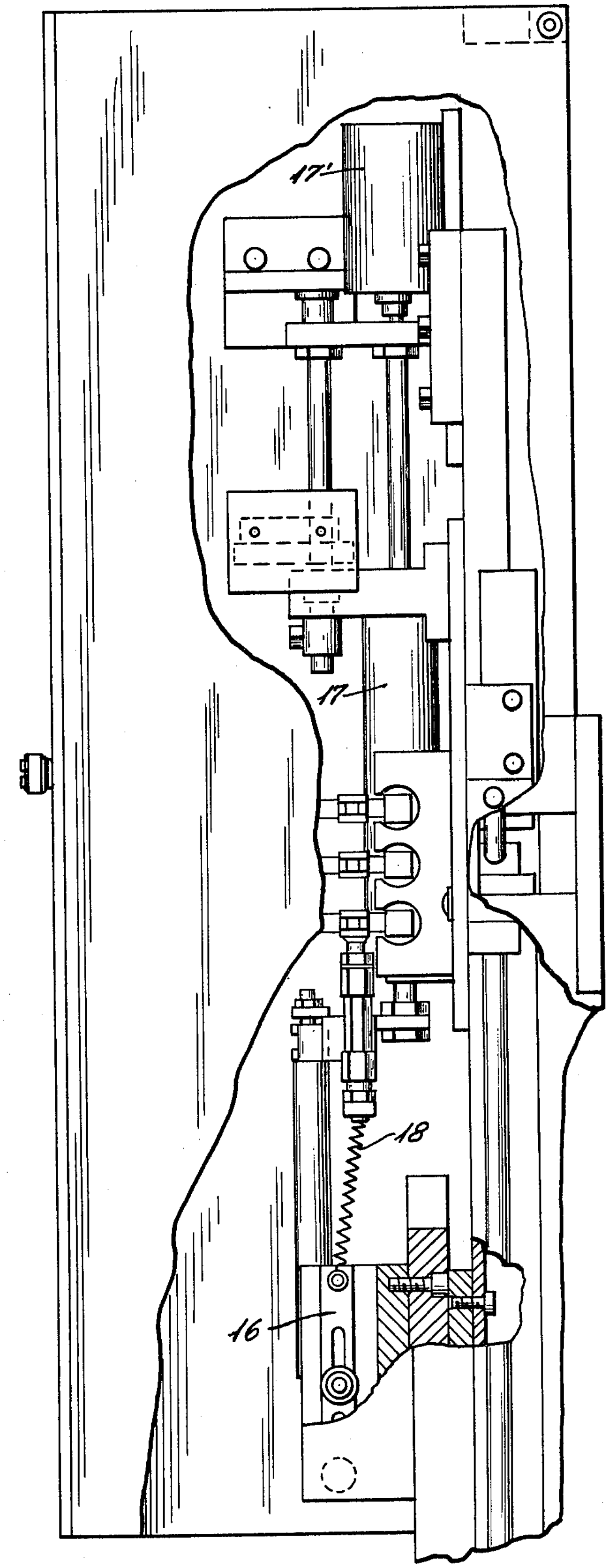
FIG. 7 is a right side elevation, of FIG. 6.

FIGS. 6 and 7 disclose a support having a vertically reciprocatable slide block 16 for attachment and support of a supply reel 20, clutch reel 30, and the insert head 40 (as illustrated in FIGS. 4 and 5). Attachment to slide block 16 is by means of machine screw 16′, seen in FIG. 6. The main support and slide block are not new in and of themselves, and are only considered novel when combined with the add-on portions of the insertion machine. The combined structure is disclosed in FIGS. 4 and 5, in which supply reel 20 is attached to L-bracket 22, as by thumbscrew 21, for supply of wire 8 to clutch reel 30 via wire-threading eye 36. Clutch reel 30 and motor 32 are mounted to slide block 16 by L-bracket 34, and clutch reel 30 is adapted to receive at least one complete loop of wire about the periphery thereof, with wire 8 being further fed down through a feed tube 96 (FIG. 12) to the bottom tip of the insertion head. A further description of the function of clutch reel 30 and various portions of the main support follows the detailed description of the insertion head.

Figure 9:
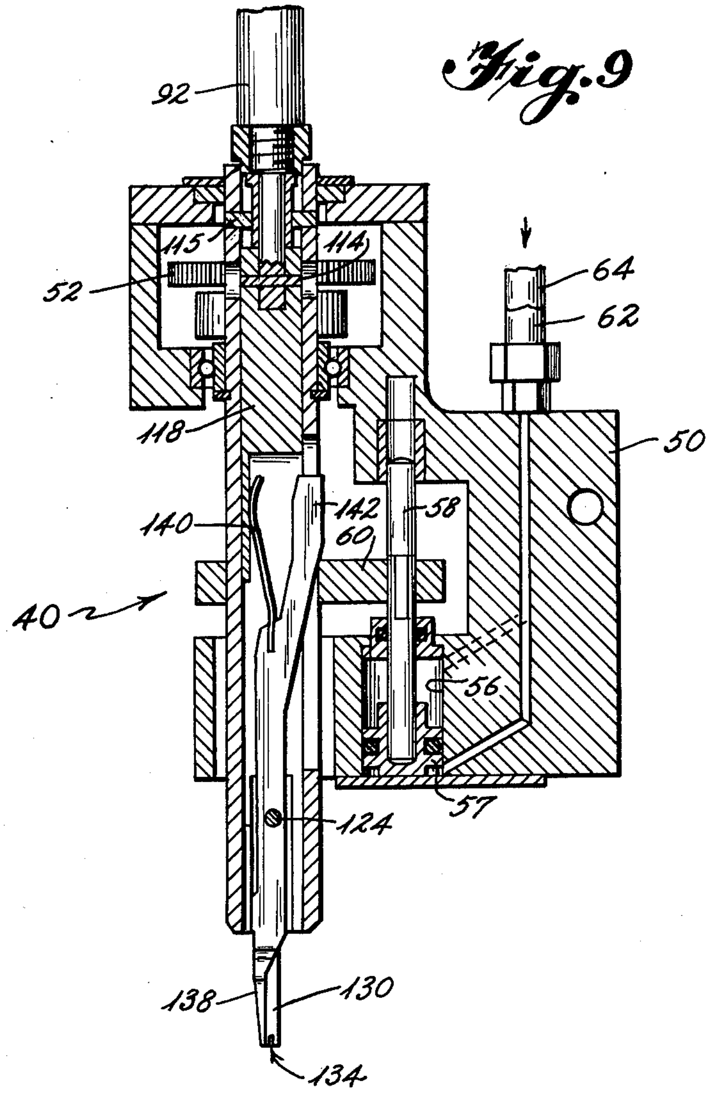
FIG. 9 is a right side elevation, partially in section, of the insert head of the instant invention.
Figure 10:
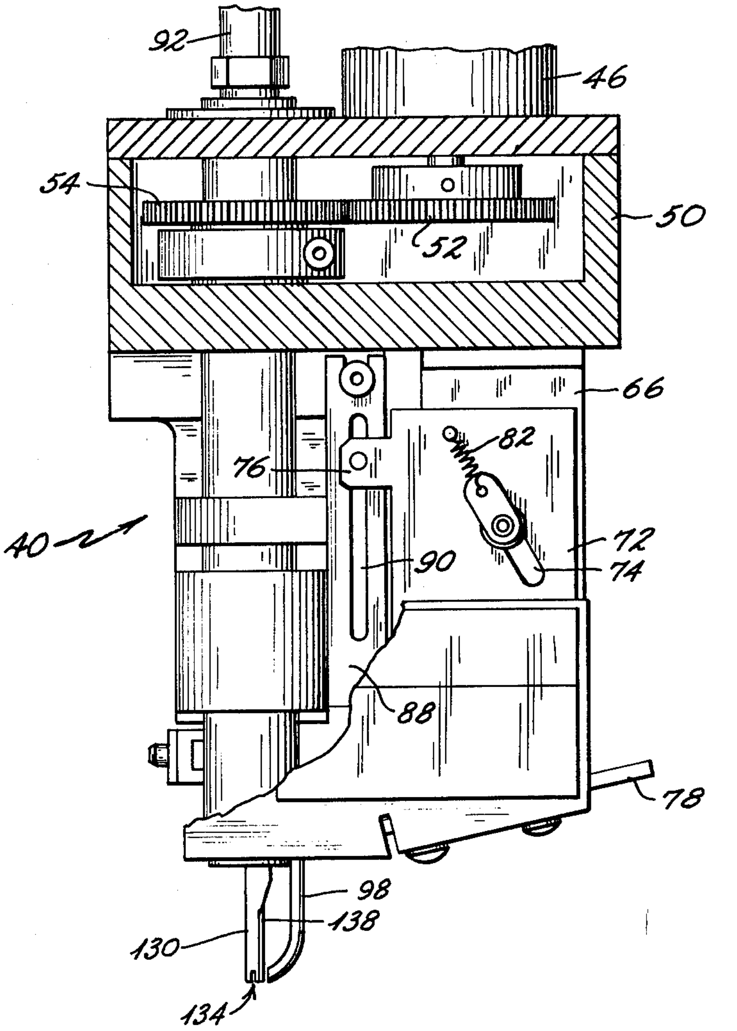
FIG. 10 is a front elevation, partially in section, of FIG. 9.
Figure 13:
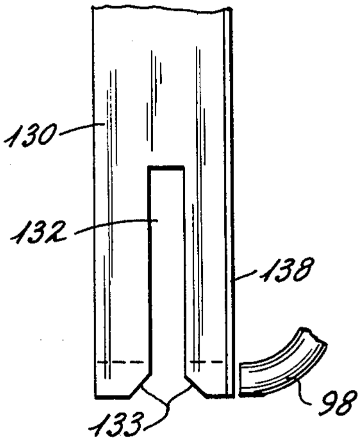
FIG. 13 is an enlarged, partial front elevation of the pusher bar of the novel insert head.
Figure 14:
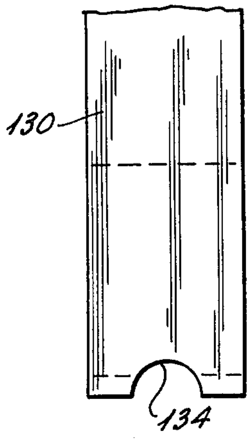
FIG. 14 is a right side elevation of the pusher bar of FIG. 13.
Figure 15:
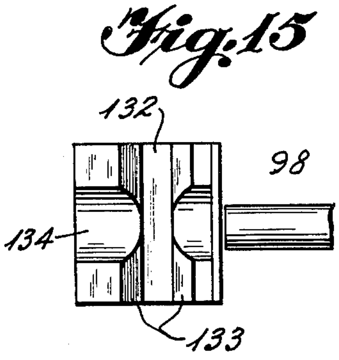
FIG. 15 is a bottom plan view of the pusher bar, of FIG. 14.
Figure 11:
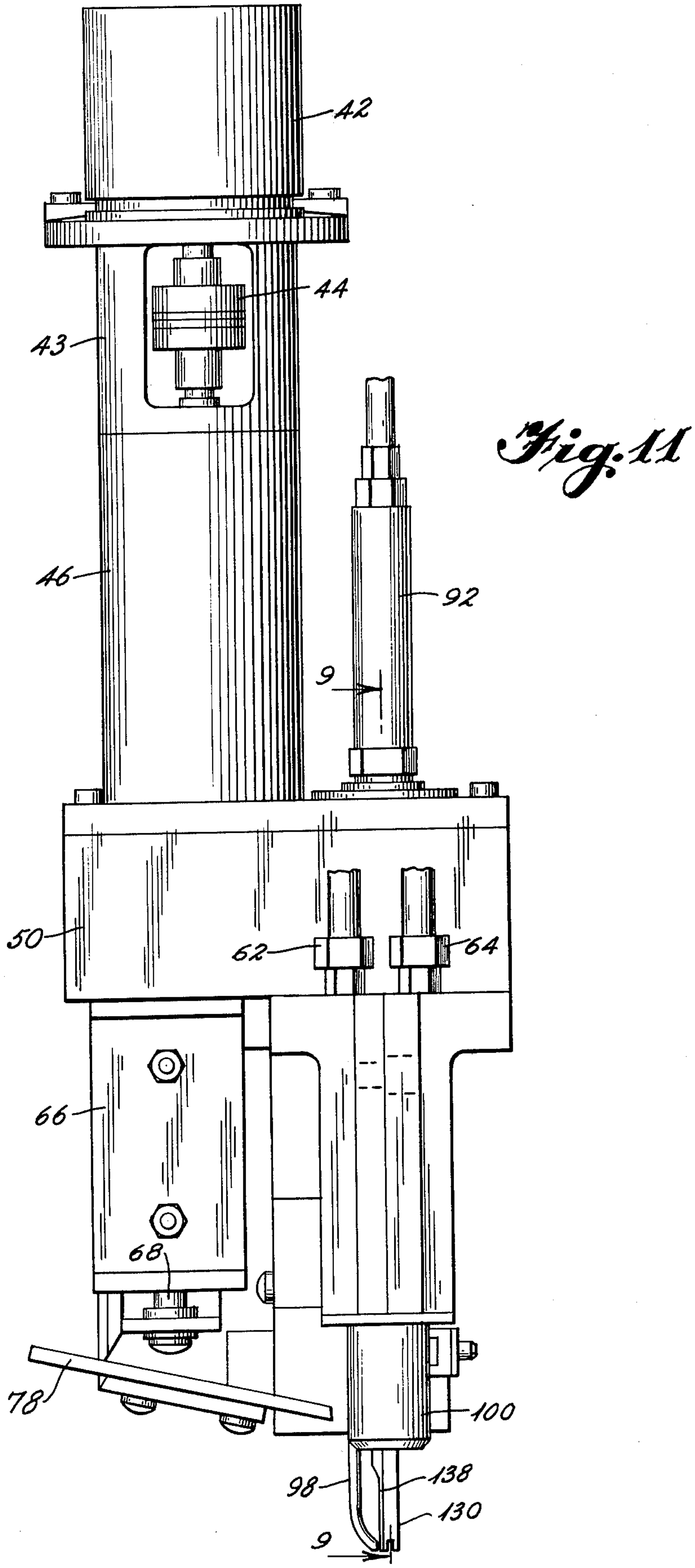
FIG. 11 is a rear elevation, partially in section of FIG. 9.
Figure 12:
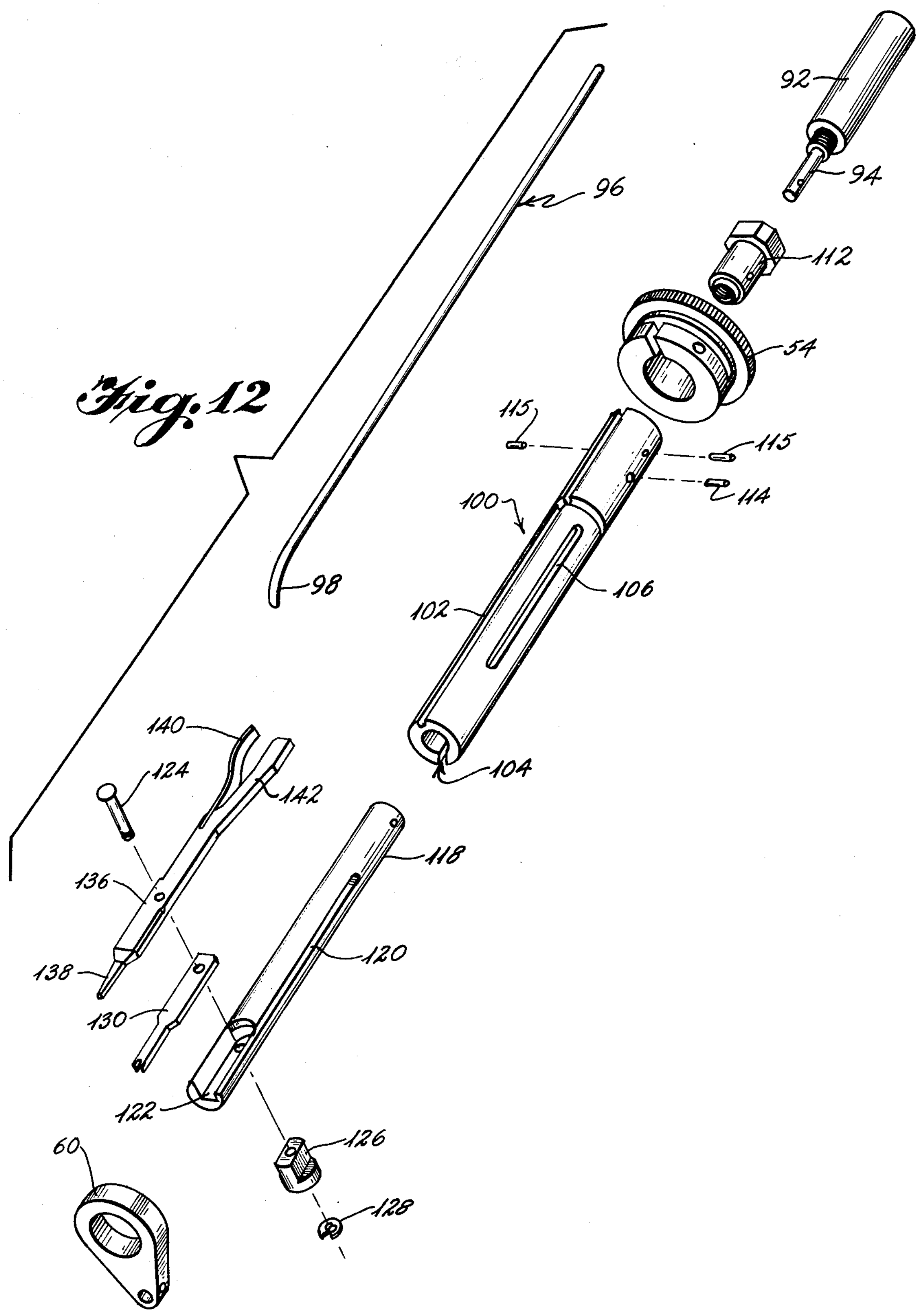
FIG. 12 is an exploded isometric view of portions of the novel insert head.

A better understanding of the insertion head may be gained from FIGS. 9–15, in which pusher 130 and cutter 136 are attached to tool holder 118. Tool 118 is provided with a pocket 122 within which the upper end of pusher 130 is held, and a cutter extension slot 120 is provided to receive cutter extension 142 and leaf spring 140. Pin 124, guide 126 and spring washer 128 attach cutter 136 and pusher 130 to tool holder 118 such that cutter 136 is pivotal about pin 124 and pusher 130 is not. Tool holder 118 is telescoped into holder tube 100 which is provided with a guide slot 104 for mating with guide 126 to prevent rotation of tool holder 118 within holder tube 100. Holder tube 100 is provided with a cutter extension opening 106 through which cutter extension 142 may extend under the influence of leaf spring 140, as best seen in FIGS. 9 and 12. The outer surface of holder tube 100 is further provided with a feed tube slot 102 for reception of feed tube 96. Precut cylinder 92 and rod 94 are provided for reciprocation of tool holder 118 relative to holder tube 100, with precut cylinder 92 being threaded into connector sleeve 112 which, in turn, is pinned to holder tube 100 by pins 115. Rod 94 is free to move relative to sleeve 112 and is pinned to tool holder 118 by pin 114. Attached to the upper end of holder tube 100 is gear 54 having a clamp welded thereto for clamping of the gear onto holder tube 100. Feed tube 96 has a curved portion 98 for directing supply wire to the tip of pusher 130. As seen in FIGS. 13–15, the tip of pusher 130 is very similar to that of prior art pusher 222 seen in FIGS. 3A–3C. Pusher 130 is provided with slot 132 within which the fingers 4 of contacts 2 are receivable and with slot 134 oriented perpendicular to slot 132 for reception of wire 8. As best seen in FIGS. 13 and 15, the body of pusher 130 is narrower on one side of slot 132 than on the other side in order that cutter 136 may be closer to slot 132 and, hence, to contact fingers 4 for the wire run termination function. Gear 54 cooperates with gear 52, as best seen in FIG. 10, in order that feed tube 98, pusher 130 and cutter 136 may be oriented about a longitudinal axis by servo motor 46. As seen in FIG. 11, a rotary encoder 42 is supported on the upper end of servo motor 46 by bracket 43 and is drivingly attached thereto by universal joint 44. Although a prototype of the instant invention provides for rotation of the tooling about its longitudinal axis to angular positions of 90°, 180°, and 270° relative to a home position, other angles of rotation may be accommodated.

One improvement of the instant invention over prior art devices incorporating a cutter and pusher is that slot 134, on the side of pusher 130 which abuts with cutter 136, acts as an anvil which, in combination with cutter blade 138 of cutter 136, provides a wire shearing function very close (nominally 0.025 inches) to the fingers 4 of contact 2 during wire run termination. Holder tube 100 is rotationally mounted within housing 50 as by conventional bearings. The body of housing 50 is milled to provide a cylinder 56 within which piston 57 is reciprocatable under the influence of air or another fluid as provided via fittings 62 and 64. Piston 57 is connected to piston rod 58 which, in turn, is connected to cutter actuator sleeve 60, as best seen in FIG. 9. Cutter actuator sleeve 60 telescopes over holder tube 100 and, when in the "down" position illustrated in FIG. 9 allows cutter extention 142 to protrude through cutter extension opening 106 of holder tube 100 under the bias of leaf spring 140. When actuator sleeve 60 is raised to the "up" position, it forces cutter extension 142 back within cutter extension opening 106 of holder tube 100 against the bias of spring 140 so that cutter 136 pivots about pin 124 and blade 138 passes across slot 134 to cut, with a shearing action, the wire supplied to pusher 130 through curved portion 98 of feed tube 96. The function and description of the remaining portion of the instant invention is best described with reference to the operation of the device.

OPERATION

In operation, a circuit board having insulation displacement-type contacts is mounted on an X-Y positioning system for positioning individual contacts below the pusher of the insert head 40 according to an automatic control such as a programmed computer. Alternatively, the circuit board could be held in a fixed position and the insert head 40 could be moved to provide the requisite positioning of the pusher relative to the contact; but the following description is directed to movement of the circuit board, with the insert head support in a fixed position.

Figure 8:
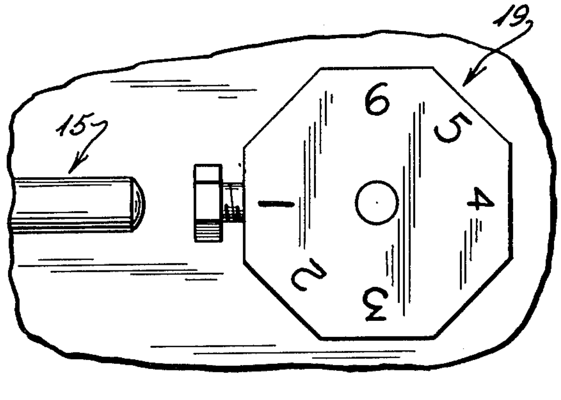
FIG. 8 is a right side elevation, as viewed along arrows 8—8 of FIG. 6, to illustrate an adjustable depth stop.

With wire threaded through feed tube 96 and into slot 134 of pusher 130, and with a contact 2 positioned below pusher 130, the device is actuated for insertion of the wire into fingers 4. With the insert head 40 mounted on slide block 16 and in a raised "repair" position under the influence of fluid cylinder 17, the insert head 40 is moved downwardly under the influence of gravity while fluid is at least partially evacuated from cylinder 17 until sensor switch contact 15 engages adjustable depth stop 19 (best seen in FIGS. 6 and 8). Adjustable depth stop 19 is rotatable by depth stop motor 9, via belt drive 13, to position one of eight possible surfaces opposite of sensor switch 15. Each of these surfaces may have a machine screw or the like threaded therein to different depths (only one of these machine screws is shown in FIG. 8) such that the amount of lowering of the insert head 40 is controlled. Retract cylinder 17 has a double acting rod extending from each end thereof with the top end of the double acting rod abutting a rod of cylinder 17'. Cylinder 17' is attached to the main frame and separate from cylinder 17 and is normally actuated such that its rod, abutting with the double-ended rod of cylinder 17, prevents full retraction of the insert head to the "repair" position. With cylinder 17' actuated in this manner, cylinder 17 can only cause partial retraction of the insert head 40 to a position such that the pusher 130 is spaced slightly above the contact fingers 4. From this position, cylinder 17 is actuated to lower pusher 130 down over fingers 4 of contact 2 such that a portion of wire 8 is inserted between fingers 4. Having done so, cylinder 17 is again actuated to retract the insert head 40 to the partially retracted position above the contacts of the board. According to the controller program, holder tube 100 is then oriented, via gears 54 and 56 and servo motor 46, to facilitate routing of a run of wire from this first contact to another contact on the circuit board, as the circuit board is repositioned to present another contact under pusher 130, whereupon the insert head 40 is again lowered to insert a second portion of wire into the other contact. This process of running wire between contacts may be continued in a daisy-chain effect between various multiple contacts until it is desired to terminate a specific wire run.

For termination of the wire run at a particular contact 2, precut cylinder 92 is actuated to extend rod 94, simultaneously with partial retraction of the insert head 40, and keep pusher 130 in contact with the wire 8 which is between fingers 4. In this manner, holder 100 and feed tube 96 are raised while tool holder 118, pusher 130 and cutter 136 remain in the "down" position. With proper location of cutter actuator 60, on rod 58 relative to cutter extension 142, cutter 136 is not actuated during this partial retraction. Rather, the relative displacement between feed tube 96 and cutter 136 pulls more wire from curved end 98 of feed tube 96. Now, cutter cylinder 56 fires, actuator 60 causes cutter blade 138 to wipe across slot 134 of pusher 130 to terminate the wire run, and precut cylinder 92 is relieved of pressure so that pusher 130 and cutter 136 retract back into holder tube 100. The additional wire pulled from feed tube 96, prior to cutting, is of sufficient length that "reloading" of slot 134 may now be performed. This "reloading" of slot 134 with wire before starting another wire run may be accomplished manually, but in keeping with the automation of this machine, a tucker subassembly has been devised.

Figure 16:
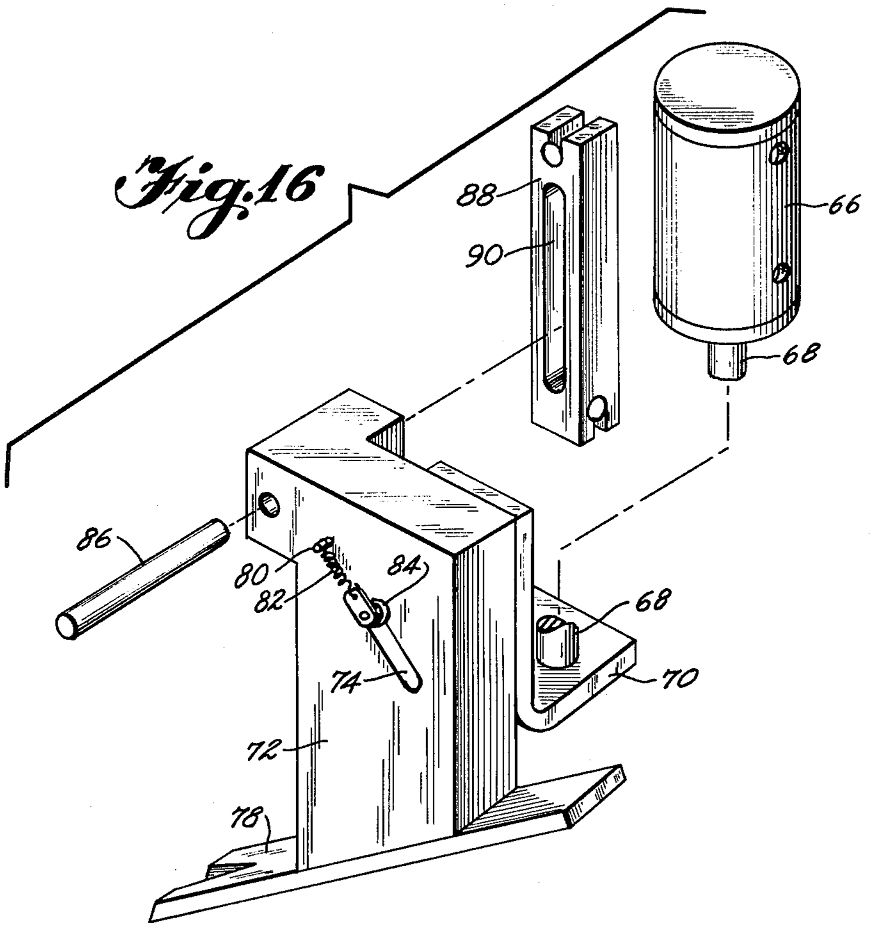
FIG. 16 is an exploded isometric view of the tucker subassembly of the novel insert head.
Figure 17:
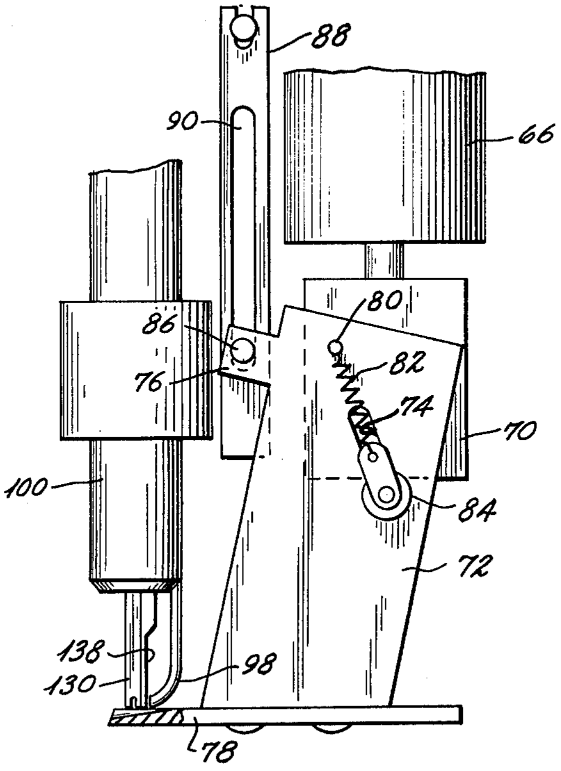
FIG. 17 is a partial front elevation of the tucker subassembly in the "tucking" position.

Referring to FIG. 16, tucker subassembly comprises tucker cylinder 66 and rod 68 for attachment to housing 50 of the insert head 40. Slide block 88 is also attached to housing 50 and is provided with a slide block slot 90 within which a pin 86 is received. Pin 86 is attached to a leg 76 of tucker block 72 such that tucker block 72 may reciprocate vertically and pivot about 86 according to the actuation of tucker cylinder 66. A bracket 70 is attached to the lower end of rod 68 and is pivotally and slidably attached to block 72 via shoulder screw 84 received in a slot 74 of block 72. Block 72 also includes a pin 80 for attachment of one end of spring 82, with the other end of spring 82 attached to shoulder screw 84. The bottom end of tucker block 72 has a tucker blade 78 attached thereto. With reference to FIG. 17, tucker cylinder 66 is actuated so that block 72 may slide downwardly under the guidance of slot 90 and pin 86 until reaching the bottom of slot 90, whereupon block 72 will pivot clockwise against the bias of spring 82 so that tucker blade 78 engages the wire extending from curved portion 98 of feed tube 96 and tucks this wire into slot 134 of pusher 130. This tucking function is accomplished after pusher 130 and cutter 136 have been retracted back into holder tube 100.

In order that wire 8 is properly supplied to pusher 130, clutch reel 30 is provided and is constantly driven by clutch reel motor 32 (FIGS. 4 and 5). Clutch reel 30 is located between supply spool 20 and feed tube 96 and has wire 8 looped about the periphery thereof by at least one complete turn. The surface of reel 30 which engages the loop of wire 8 is provided with a high coefficient of friction such as a dense rubber cover, such that movement of the circuit board from one contact to another in completing a wire run causes tightening of the loop about clutch reel 30. Since clutch reel 30 is constantly rotated (in a clockwise direction as viewed in FIG. 4), the wire paid out of feed tube 96 during a wire run is taut and undue drag caused by the inertia of supply spool 20 is eliminated during the wire run. When the positioning system stops at a particular contact, the wire is no longer taut around the clutch spool, due to the constant rotation thereof by motor 32, and feed of the wire is thus halted.

Referring again to FIG. 5, a counterbalance spring 18 is provided between the main support and slide block 16 such that if the insert head 40 encounters an obstacle during insertion, i.e., a bent finger of contact 2, spring 18 will retract the insert head 40 away from the contact. As previously mentioned, the insert head 40 may be further retracted to a repair position by retracting the piston rod of cylinder 17', so that various maintenance functions or removal and replacement of circuit boards may be accomplished without the insert head 40 being in the way.

In a prototype of the invention, precut cylinder 92 is actuated by air to extend rod 94, and rod 94 is retracted by an internal spring of cylinder 92 when air pressure is removed. Such a cylinder is manufactured by Clippard Instrument Laboratories, Inc., under Model No. 3SS.

It will thus be seen that the objects set forth above, among those made apparent from the preceding description, are efficiently attained and, since certain changes may be made in carrying out the above method and in the construction set forth without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention, which, as a matter of language, might be said to fall therebetween.

Now that the invention has been described, what is claimed as new and desired to be secured by Letters Patent is:

1. In an apparatus for connecting wire to circuit board-mounted, insulation displacement-type contacts, each of said contacts having fingers between which said wire is conductively gripped, said apparatus comprising supply means for supplying said wire to a pusher means for engaging and pushing a portion of said wire between said fingers to establish conductive gripping thereof by said fingers, the improvement comprising:

means for positioning one of said contacts and a pusher of an insert head opposite each other and orienting said pusher about a generally longitudinal axis of said pusher and relative to said fingers according to an orientation of said one contact upon a circuit board;

means for feeding and guiding said wire from said supply means to said pusher means, said guiding means comprising a tube through which said wire is fed adjacent a wire receiving groove in a face of said pusher;

means for extending said insert head and said pusher toward one of said contacts to an extended position and driving a first portion of said wire into said fingers by said pusher to establish said conductive gripping;

means for retracting said head and clearing said pusher from said one contact while paying out said wire from said supply means;

means for positioning another contact of said circuit board and said pusher opposite one from each other while paying out said wire from said supply between said one and another contacts and keeping said wire positioned relative to said head for said driving;

means for extending said head and said pusher toward said other contact to said extended position and during a second portion of said wire into fingers thereof by said pusher to establish said conductive gripping and an electrical connection between said one and another contacts;

means for cutting said wire to terminate said electrical connection at said other contact and to provide a remaining supply portion of said wire not connected to said contacts, said cutting means being positioned between said pusher and said tube such that said wire is cut on an opposite side of said fingers of said other contact from said wire between said one and another contact without raising said pusher from said extended position at said other contact; and means for automating and controlling said orienting, positioning, feeding, extending, driving, retracting, and cutting.

2. An improvement as in claim 1, and further comprising:

means for reorienting said pusher prior to driving said second portion of wire into the fingers of said other contact.

3. An improvement as in claim 1, and further comprising:

means for retracting said head while leaving said pusher in said extended position and paying out said remaining supply portion of wire from said supply, prior to said cutting and after said driving of said second portion, to provide a starter amount of said wire; and means for retracting said pusher from said extended position and clearing said other contact.

4. An improvement as in claim 1, and further comprising:

means for tucking a starter amount of wire of said supply into a driving relation with said pusher.

5. An improvement as in claim 1, and further comprising: means for tucking said remaining supply portion of said wire into a driving relation with said pusher.

6. An improvement as in claim 5, and further comprising:

means for further retracting said head and pusher away from said contacts to a repair position, prior to said tucking.

7. An improvement as in claim 1, and further comprising:

means for moving said circuit board to sequentially position individual contacts opposite from said pusher for said driving.

8. An improvement as in claim 7, and further comprising:

means for routing said wire around intermediate contacts during said moving.

9. An improvement as in claim 1, and further comprising:

means for moving said insert head to sequentially position said pusher opposite from individual contacts for said driving.

10. An improvement as in claim 1, and further comprising:

means for adjusting said extending of said head.

11. An improvement as in claim 1, and further comprising:

means for sensing a pressure on said pusher during said driving and for retracting said pusher when said pressure is greater than a reference pressure.

12. An improvement in claim 1, wherein:

said feeding means, between said supply and said pusher, comprises a driven feed reel having a resilient wire engaging portion about which said wire is looped at least once, such that smooth feeding of said wire is provided from said supply and drag of said supply is obviated.

13. An improvement as in claim 1, and further comprising:

means for tucking said remaining supply portion into said wire receiving groove of said pusher.

14. In an apparatus for connecting wire to circuit board-mounted insulation displacement-type contacts, said contacts having fingers between which said wire is conductively gripped, said apparatus comprising supply means for supplying said wire to a pusher means for engaging and pushing a portion of said wire between said fingers to establish conductive gripping thereof by said fingers and means for guiding said wire from said supply means to said pusher means, the improvement comprising:

means for cutting said wire, said cutting means positioned between said guiding means and said pusher means such that said wire is connectable between one and another of said contacts, at first and second portions of said wire respectively, to provide an electrical connection therebetweeen and is terminatable by said cutting means on a side of said other contact opposite from said electrical connection without removing said pusher means from said second portion.

* * * * *